United States Patent
Lee

(10) Patent No.: US 8,037,588 B2
(45) Date of Patent: Oct. 18, 2011

(54) BACK-UP TABLE FOR CHIP MOUNTER

(75) Inventor: Tae-Young Lee, Yongin-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 787 days.

(21) Appl. No.: 12/082,032

(22) Filed: Apr. 8, 2008

(65) Prior Publication Data

US 2008/0250630 A1    Oct. 16, 2008

(30) Foreign Application Priority Data

Apr. 13, 2007  (KR) .................. 10-2007-0036392

(51) Int. Cl.
*B25B 27/14* (2006.01)

(52) U.S. Cl. .......... 29/281.4; 29/281.1; 29/739; 29/730; 269/1; 269/21

(58) Field of Classification Search ............... 29/281.4, 29/739, 740, 281.1; 269/1, 71, 21
See application file for complete search history.

(56) References Cited

U.S. PATENT DOCUMENTS

| | | | | |
|---|---|---|---|---|
| 4,744,712 A * | 5/1988 | Mitchell | ...... | 414/217 |
| 4,993,696 A * | 2/1991 | Furukawa et al. | ...... | 269/73 |
| 6,189,876 B1 * | 2/2001 | Frazier | ...... | 269/21 |
| 6,271,657 B1 * | 8/2001 | Nemoto | ...... | 324/750.25 |
| 6,347,442 B1 * | 2/2002 | Hwang | ...... | 29/281.4 |

FOREIGN PATENT DOCUMENTS

| | | |
|---|---|---|
| KR | 0131578 Y1 | 9/1998 |
| KR | 1020070004350 A | 1/2007 |

* cited by examiner

*Primary Examiner* — Carl Arbes
(74) *Attorney, Agent, or Firm* — Drinker Biddle & Reath LLP

(57) ABSTRACT

A back-up table for a chip mounter. The back-up table for a chip mounter includes a base plate, a back-up plate spaced a predetermined distance from the base plate to support a back-up pin that supports a printed circuit board, and at least one set of link units installed between the base plate and the back-up plate and facing opposite to each other. The back-up table further comprises a first driving part installed between the opposite facing link units and operating the link units to raise and lower the back-up plate, and a second driving part serially connected to the first driving part.

20 Claims, 15 Drawing Sheets

BACK-UP TABLE FOR CHIP MOUNTER

CROSS-REFERENCE TO RELATED APPLICATION

This application claims the benefit of Korean Patent Application No. 2007-0036392, filed Apr. 13, 2007, the entire content of which is hereby incorporated herein by reference.

BACKGROUND OF THE INVENTION

1. Field of the Invention

The present invention relates to a back-up table for a chip mounter, and more particularly, to a back-up table for a chip mounter used in equipment for supporting a printed circuit board on a certain position in the chip mounter.

2. Description of the Related Art

In general, a chip mounter is a device for mounting small electronic components such as a semiconductor chip on a printed circuit board. The chip mounter picks up electronic components supplied through a component supply device using a pickup mechanism movable on an X- and Y-axis frame, and then mounts the components onto the printed circuit board conveyed by a board conveyance device.

When the electronic components are completely conveyed to a mounting position by the board conveyance device, the printed circuit board is raised to a predetermined position by a back-up table disposed under the printed circuit board. Then, the pick-up mechanism moves onto the printed circuit board, and a suction means is lowered onto the printed circuit board to mount the electronic components on the printed circuit board.

FIG. 1 is a front view of a conventional back-up table for a chip mounter. The conventional back-up table for a chip mounter includes an upper table 1 on which a printed circuit board (not shown) is mounted, a lower table 2 disposed under and spaced apart from the upper table 1, and a pneumatic cylinder 3 installed at the lower table 2 to raise/lower the upper table 1.

In addition, a guide part 4 is installed at edge parts of the upper table 1 and the lower table 2. The guide part 4 includes a plurality of guide rods 5 fixed to a lower surface of the upper table 1, and a plurality of guide holes 6 formed in the lower table 2 and through which the guide rods 5 pass.

Here, the pneumatic cylinder 3 is disposed at center parts of the upper and lower tables 1 and 2. One end of a rod 3a of the pneumatic cylinder 3 is fixed to the lower surface of the upper-table 1. In addition, the guide part 4 is disposed at the edge parts of the upper and lower tables 1 and 2.

However, in the conventional back-up table for a chip mounter as described above, horizontality of the upper table generally cannot be maintained upon upward movement of the upper table, and therefore the printed circuit board cannot be uniformly supported.

Korean Utility Model Registration No. 131578 discloses another back-up table for a chip mounter. That is, the utility Model discloses technology using a stepping motor and a raising/lowering device mechanically connected to the stepping motor to variously adjust the height of the back-up table without using a pneumatic cylinder. However, the conventional back-up table for a chip mounter has disadvantages of complicating the entire structure and increasing the entire manufacturing cost.

SUMMARY OF THE INVENTION

The present invention provides a back-up table for a chip mounter capable of simplifying the entire structure, reducing manufacturing costs, and freely adjusting the height of the back-up table in a multistage manner.

According to a first aspect of the present invention, a back-up table for a chip mounter includes: a base plate; a back-up plate spaced a predetermined distance from the base plate to support a back-up pin that supports a printed circuit board; at least one set of link units installed between the base plate and the back-up plate and facing opposite to each other; a first driving part installed between the opposite facing link units and operating the link units to raise and lower the back-up plate; and a second driving part serially connected to the first driving part.

Each of the link units may include: a first link pivotally connected to a lower surface of the base plate; and a second link pivotally connected to an upper surface of the back-up plate and rotatably connected to the first link by a support pin.

According to a second aspect of the present invention, a back-up table for a chip mounter includes: a base plate; a back-up plate installed over and spaced a predetermined distance from the base plate; at least one set of folding units installed between the base plate and the back-up plate and facing opposite to each other; a first driving part installed between the opposite facing folding units and operating the folding units to raise and lower the back-up plate; and a second driving part serially connected to the first driving part.

A resilient member may be installed at an upper surface of the base plate to upwardly support the back-up plate.

The folding units may include a rotary rod rotatably installed at the upper surface of the base plate; a pair of first support brackets fixed to the base plate to support both ends of the rotary rod; a pair of links coupled to both ends of the first support brackets; a pivot plate coupled to the pair of links; and a pair of second support brackets fixed to the back-up plate to support both ends of the pivot plate.

Bearings may be installed in the first support brackets, the links, and the second support brackets.

The bearings may be supported by thresholds formed in the first support brackets, the links, and the second support brackets.

The first support brackets may be fastened to the base plates by bolts, and the second support brackets may be fastened to the back-up plates by bolts.

BRIEF DESCRIPTION OF THE DRAWINGS

The above and other features of the present invention will be described in reference to certain exemplary embodiments thereof with reference to the attached drawings in which.

DETAILED DESCRIPTION OF THE EMBODIMENTS

Figure 1:
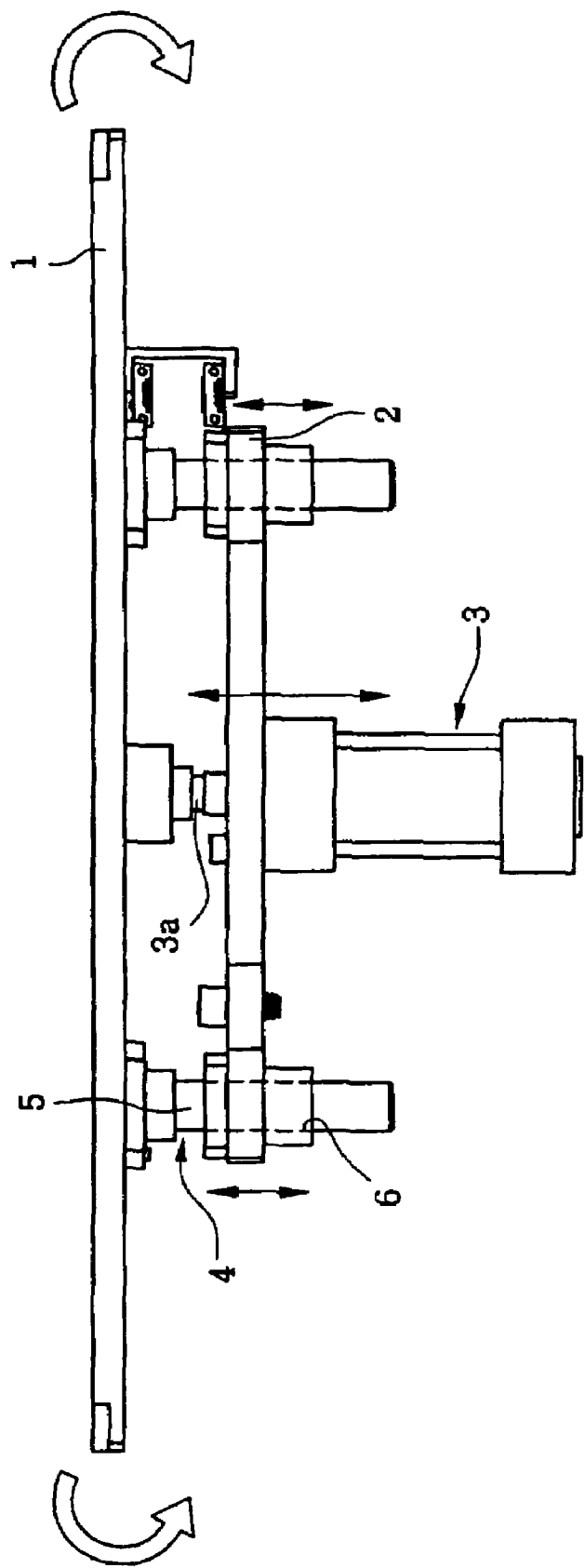
FIG. 1 is a front view of a conventional back-up table for a chip mounter.

Embodiments of the present invention will be described below in more detail with reference to the accompanying drawings. The present invention may, however, be embodied in different forms and should not be construed as being limited to the embodiments set forth herein. Rather, these embodiments are provided to assist one skilled in the art to understand the invention. Also, like reference numerals refer to like elements throughout the accompanying figures.

Figure 2:
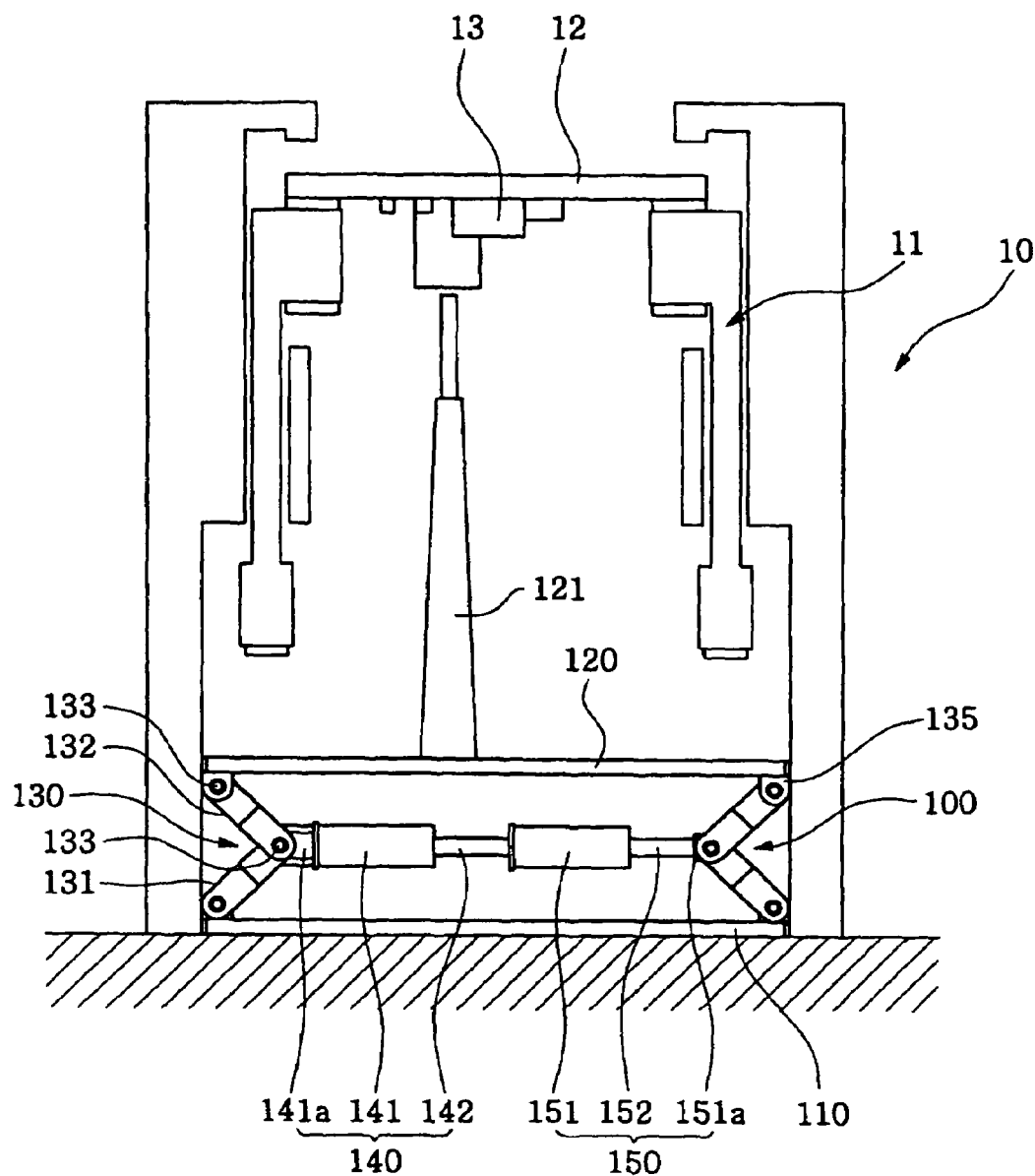
FIG. 2 is a front view showing installation of a back-up table for a chip mounter in accordance with an exemplary embodiment of the present invention.
Figure 3:
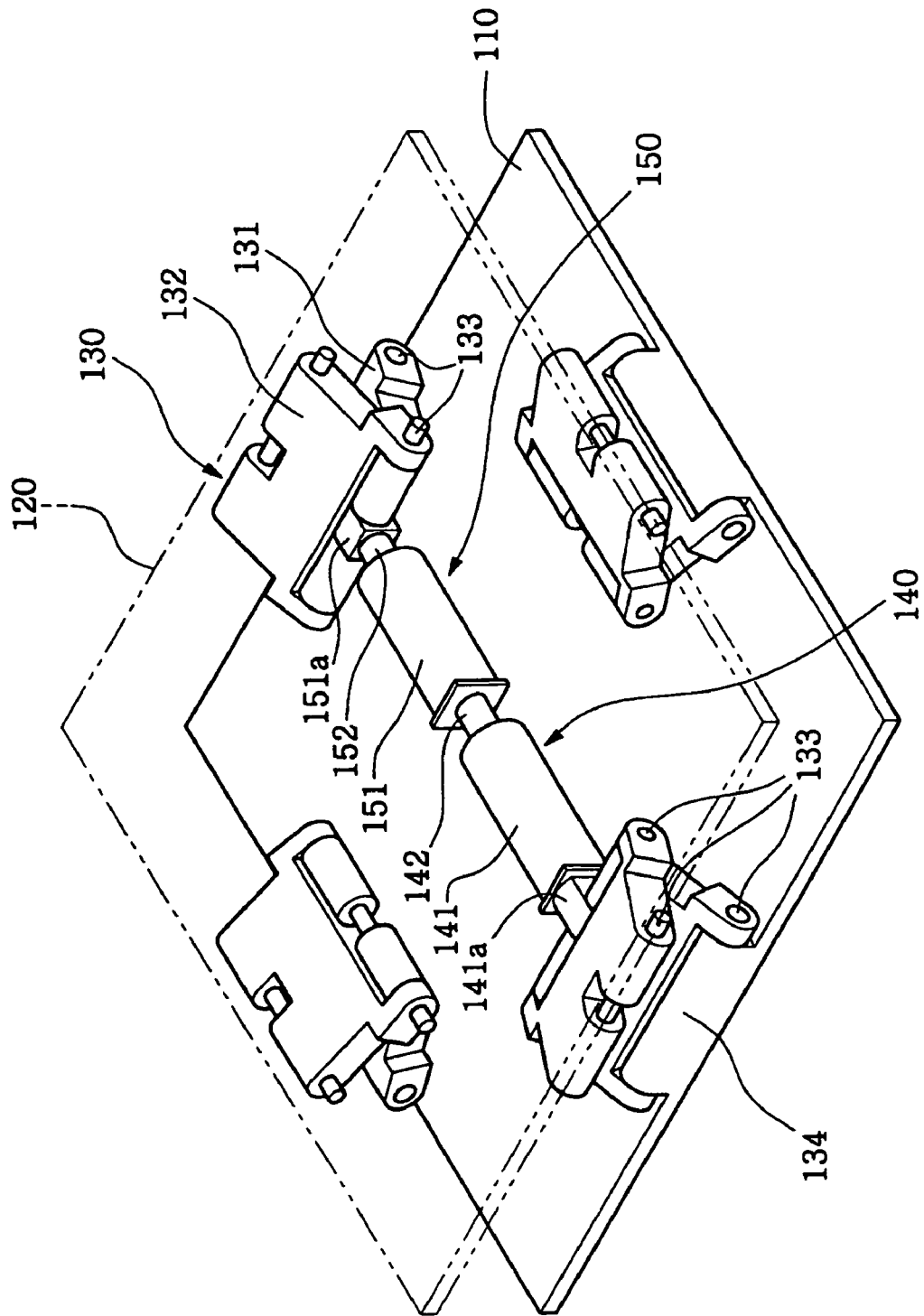
FIG. 3 is a perspective view showing an example of a folded state of the back-up table for a chip mounter shown in FIG. 2.
Figure 4:
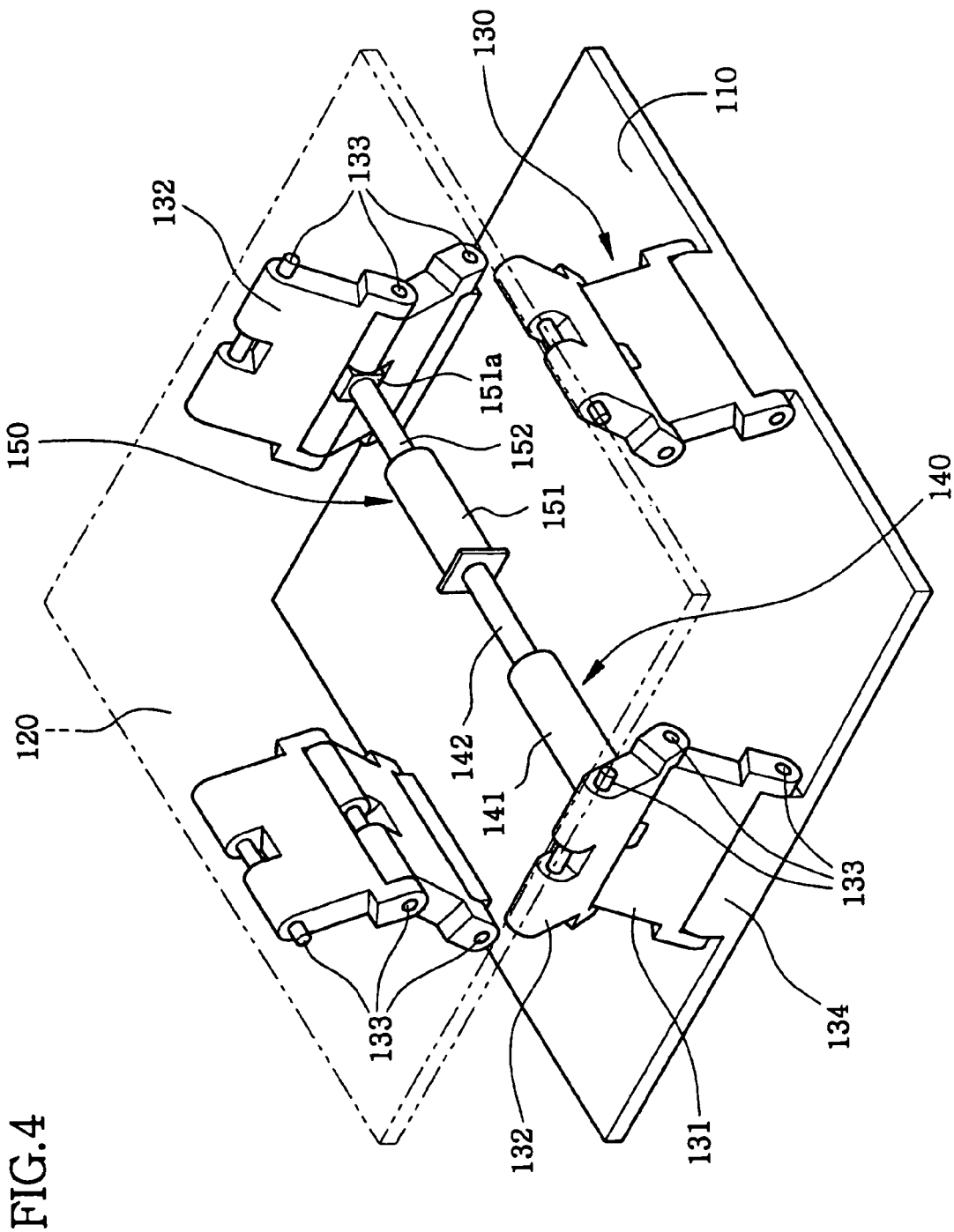
FIG. 4 is a perspective view showing an example of an unfolded state of the back-up table for a chip mounter shown in FIG. 2.
Figure 5:
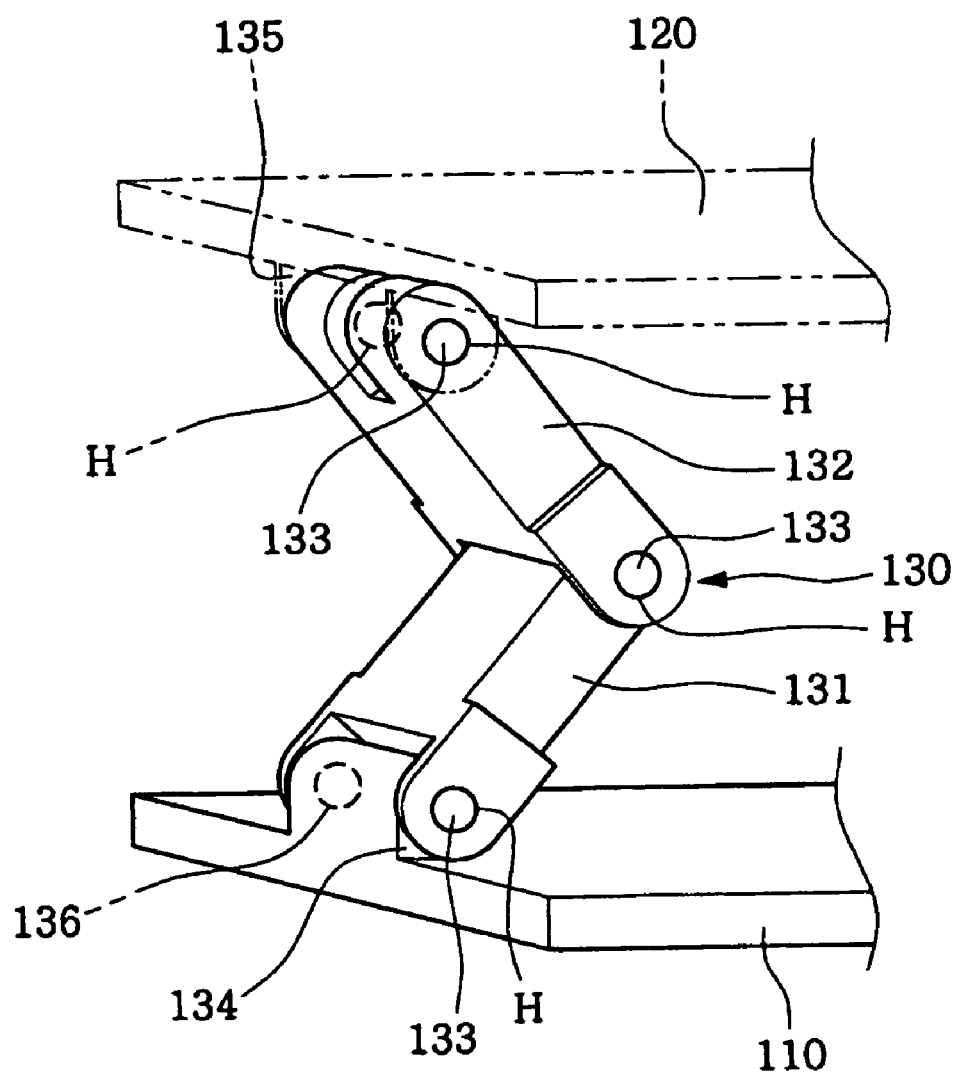
FIG. 5 is a perspective view showing an example of a link unit of the back-up table for a chip mounter shown in FIG. 2.

FIG. 2 is a front view showing installation of a back-up table 100 for a chip mounter 10 in accordance with an exemplary embodiment of the present invention. FIG. 3 is a perspective view showing a folded state of the back-up table for a chip mounter shown in FIG. 2. FIG. 4 is a perspective view showing an unfolded state of the back-up table for a chip mounter shown in FIG. 2, and FIG. 5 is a perspective view of a link unit of the back-up table for a chip mounter shown in FIG. 2.

As shown in FIGS. 2 to 5, a back-up table 100 for a chip mounter 10 in accordance with an exemplary embodiment of the present invention includes a base plate 110 and a back-up plate 120. The base plate 110 is fixed to the ground, and the back-up plate 120 is installed to be spaced a predetermined distance from the base plate 110. A back-up pin 121 may be installed on an upper surface of the back-up plate 120 to support a printed circuit board 12.

Two sets of link units 130 are installed between the base plate 110 and the back-up plate 120 to face each other. Here, while the exemplary embodiment discloses the two sets of link units 130, one set of link units 130 may be installed depending on design conditions.

Each of the link units 130 includes a first link 131 pivotally connected to an upper surface of the base plate 110, and a second link 132 pivotally connected to a lower surface of the back-up plate 120 and rotatably connected to the first link 131 by a support pin 133. The first link 131 and the second link 132 may be folded or unfolded about the support pins 133.

More specifically, examining the link unit 130, a set of support protrusions 134 and 135 protrude from the upper surface of the base plate 110 and the lower surface of the back-up plate 120, respectively. Insertion holes 136 are formed in the support protrusions 134 and 135, respectively.

Holes (H) are also formed in both ends of the first link 131 and the second link 132. The holes 136 of the support protrusions 134 and 135 are arranged on the same line as the holes 136 of the first link 131 and the second link 132. In this state, the support pins 133 are inserted into the holes 136 such that the first and second links 131 and 132 can be rotated.

In the connection structure of the first and second links 131 and 132, the other end of the first link 131 is inserted into the other end of the second link 132 to connect the first link 131 to the second link 132 (see FIG. 5). In addition, while not shown, the other end of the second link 132 is inserted into the other end of the first link 131 to connect the second link 132 to the first link 131.

A first driving part 140 and a second driving part 150 connected to each other are installed between the link units 130 such that the link units 130, facing opposite to each other, are folded or unfolded to raise and lower the back-up plate 120. Here, the first driving part 140 and the second driving part 150 are arranged in a straight line. In addition, the first driving part 140 and the second driving part 150 may be single acting pneumatic cylinders.

The first driving part 140 may include a cylinder body 141 for receiving air pressure from the exterior, and a rod 142 coupled to the cylinder body 141 to reciprocate therethrough. A first connection part 141a is installed at one end of the cylinder body 141 to be connected to the support pin 133.

In addition, the second driving part 150 may also include a cylinder body 151 for receiving air pressure from the exterior, and a rod 152 coupled to the cylinder body 151 to reciprocate therethrough. A second connection part 151a is installed at one end of the rod 152 to be connected to the support pin 133. The first connection part 141a and the second connection part 151a function to connect the first driving part 140 and the second driving part 150 to the support pins 133, respectively.

Hereinafter, operation of the back-up table for a chip mounter in accordance with an exemplary embodiment of the present invention will be described.

In a chip mounter 10, in order to mount an electronic component 13 such as a semiconductor chip on the printed circuit board 12 introduced into a conveyor 11, the back-up table 100 functions to securely support the printed circuit board 12. When the first driving part 140 and the second driving part 150 are operated to outwardly press the link units 130 using air pressure supplied from the exterior, the first and second links 131 and 132 connected by the support pins 133 are unfolded to raise the back-up plate 120. At this time, the back-up pin 121 supported by the back-up plate and preventing the printed circuit board 12 from sagging is raised to securely support a rear surface of the printed circuit board 12, thereby raising the printed circuit board 12 to a predetermined position. In this example, two sets of link units 130 are disposed between the base plate 110 and the back-up plate 120 to uniformly support the back-up plate 120. For reference, when the back-up pin 121 is used to mount the electronic component 13 on the printed circuit board 12 introduced into the conveyor 11 of the chip mounter 10, in order to prevent the back-up pin 121 from colliding with the electronic component 13 mounted on a lower surface of the printed circuit board 12, the height of the component 13 mounted on the lower surface of the printed circuit board 12 should be considered before actually raising the printed circuit board 12. On the contrary, when there is no component 13 mounted on the lower surface of the printed circuit board 12 or the back-up pin 121 is not used, there is no necessity to consider the height of the component 13 mounted on the lower surface of the printed circuit board 12. However, when a raising operation is performed in a state in which an upward stroke of the back-up table 100 is unnecessarily increased, an operation time may be largely increased.

In addition, when a raising speed is increased in order to reduce a raising time of the entire stroke of the back-up table 100, clamping or unclamping operation of the printed circuit board 12 may damage to the electronic component 13 of the printed circuit board 12 to break down the electronic component 13 mounted on the printed circuit board 12. If necessary, by appropriately adjusting a lowering stroke of the back-up table 100, even though the back-up pin 121 is not used due to improvement of equipment efficiency or there is no component mounted on the printed circuit board 12, it is possible for the back-up table 100 to more stably support the printed circuit board 12. Therefore, the back-up table for a chip mounter 100 in accordance with the present invention has been invented in consideration of the above characteristics.

For example, the chip mounter allows use of a printed circuit board having a maximum thickness of 4.2 mm or about 4.2 mm in this example. When the chip mounter allows use of a component, mounted on a lower surface of the printed circuit board, having a maximum height of 25 mm or about 25 mm in this example, the back-up table should have a stroke of 30 mm or about 30 mm, in which the thickness of 5 mm or about 5 mm of the printed circuit board is added to the height of 25 mm or about 25 mm of the component mounted on the printed circuit board.

The first driving part 140 and the second driving part 150 as pneumatic cylinders horizontally disposed for performing upward and downward motion of the back-up table move forward by a stroke of 24 mm or about 24 mm. Providing that 18 mm or about 18 mm of the stroke of 24 mm or about 24 mm is a cylinder stroke for upward movement, only the other 6 mm or about 6 mm is a strike section in which the printed circuit board 12 is actually raised to perform upward movement of 5 mm or about 5 mm.

In use of the back-up table and in production of the printed circuit board 12 when there is no component mounted on a lower surface of the printed circuit board or the back-up pin 121 is not used, the stroke or 18 mm or about 18 mm of the first and second driving parts 140 and 150 may cause waste of time and energy. Therefore, the first driving part 140 and the second driving part 150 may be serially connected to provide two downward moving positions of the back-up table 100 as follows.

In the first driving part 140, the stroke of 24 mm or about 24 mm is needed to perform the upward movement of 30 mm or about 30 mm, and it is provided that the stroke of the first driving part 140 is at or about 18 mm, and the stroke of the second driving part 150 is at or about 6 mm. Here, a term "forward motion" refers to the case in which the first driving part 140 and the second driving part 150 outwardly push the link units 130, respectively, to raise the back-up plate, and a term "backward motion" refers to the opposite case of the forward motion.

Figure 6:
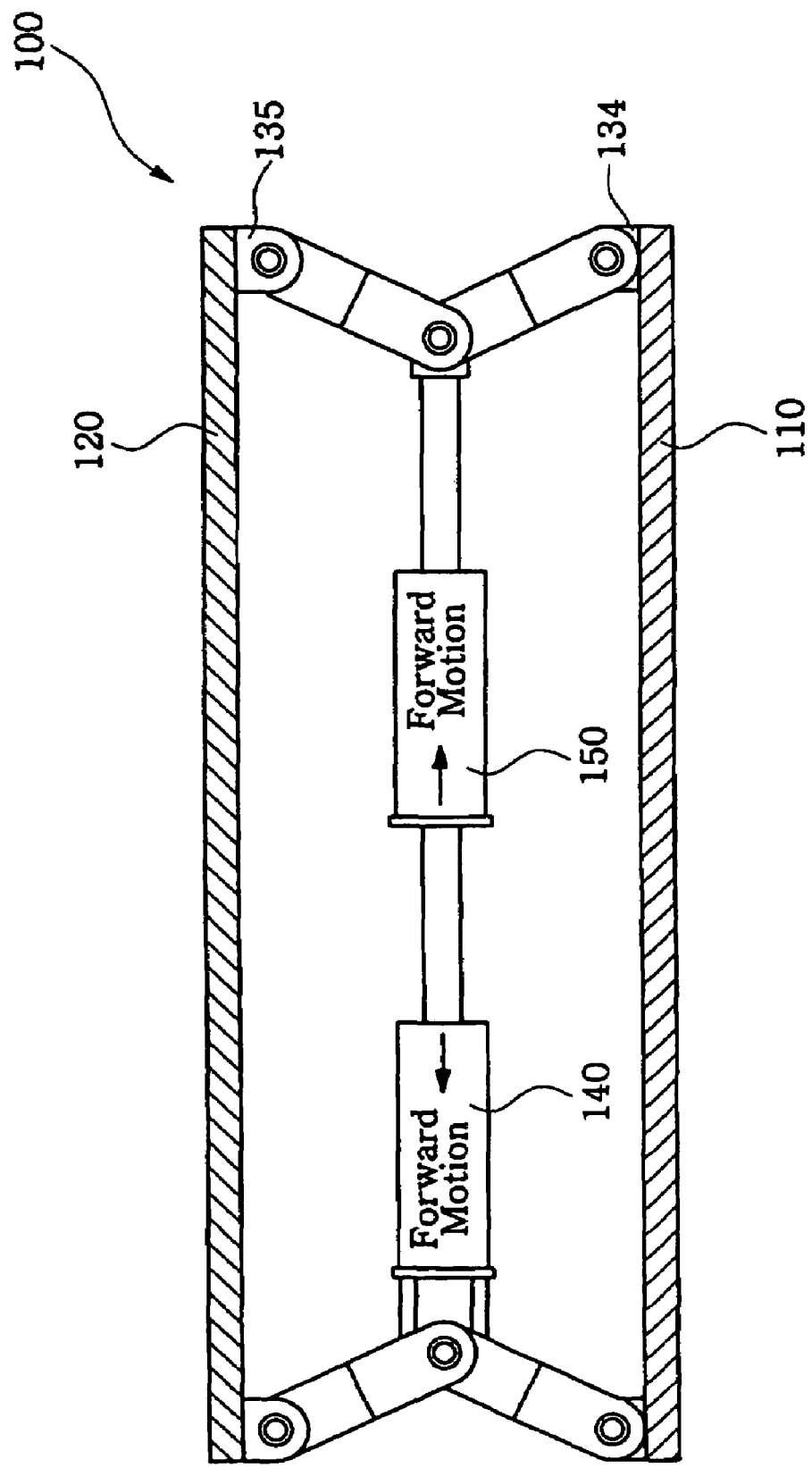
FIGS. 6 to 9 are views for explaining exemplary height adjustment of the back-up table depending on the drive of a first driving part and a second driving part, in the back-up table for a chip mounter shown in FIG. 2.
Figure 9:
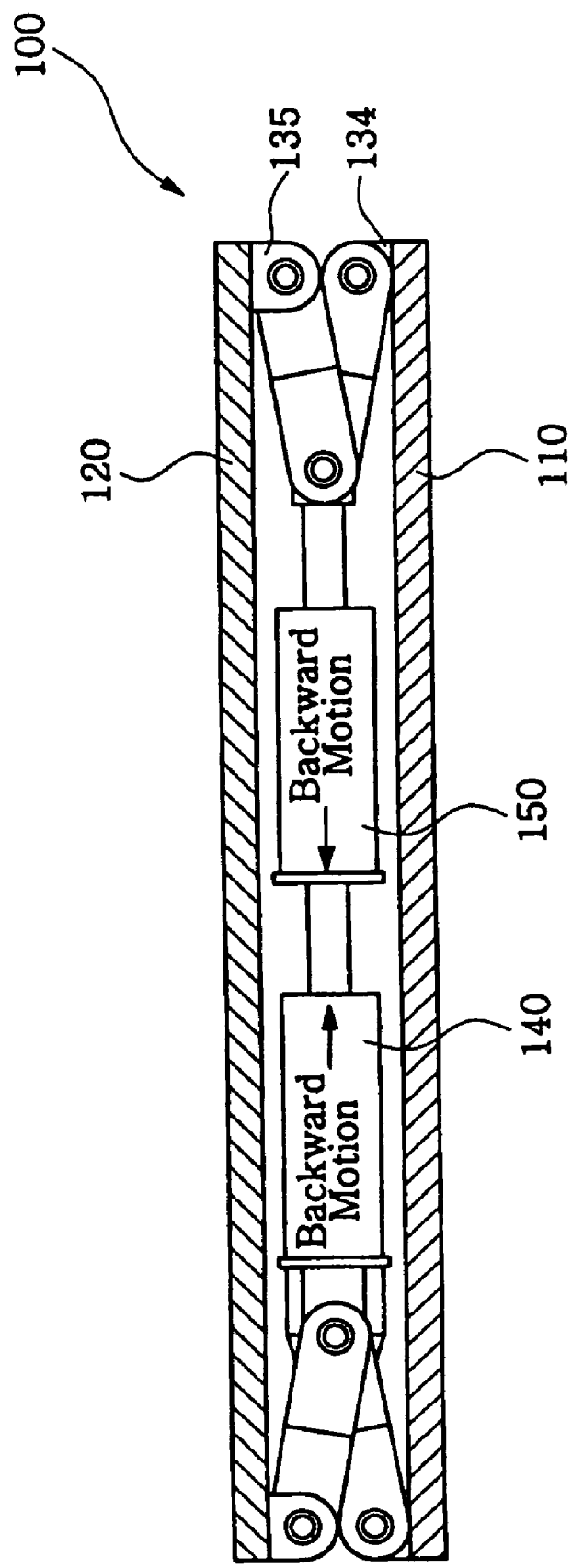

First, the case in which an electronic component is mounted on a lower surface of a printed circuit board and the back-up pin is used (an upward and downward stroke of the back-up table is 30 mm or about 30 mm).
1) Upward movement: the first driving part—forward motion, the second driving part—forward motion (see FIG. 6)
2) Downward movement: the first driving part—backward motion, the second driving part—backward motion (see FIG. 9).

Figure 7:
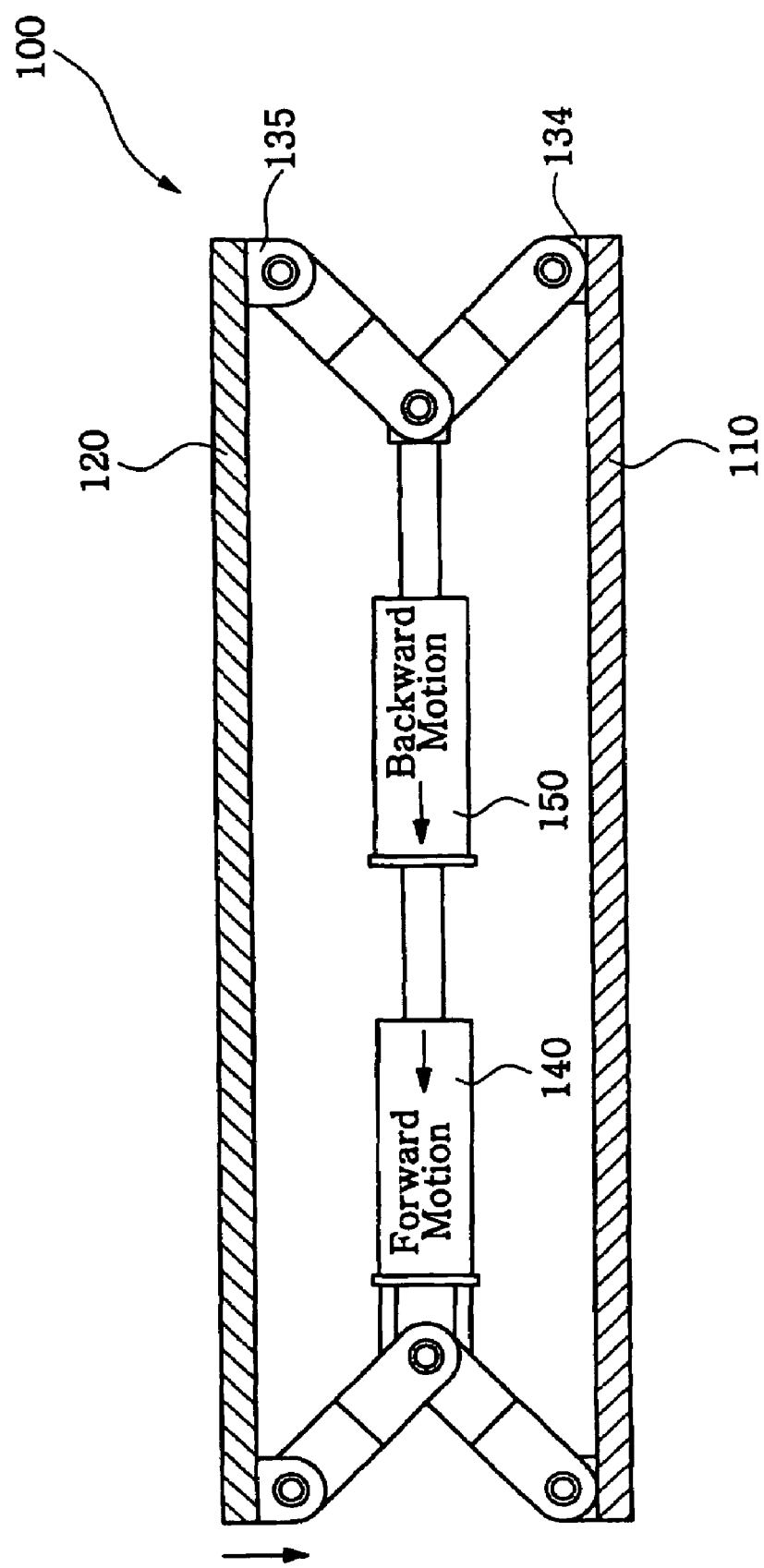
Figure 8:
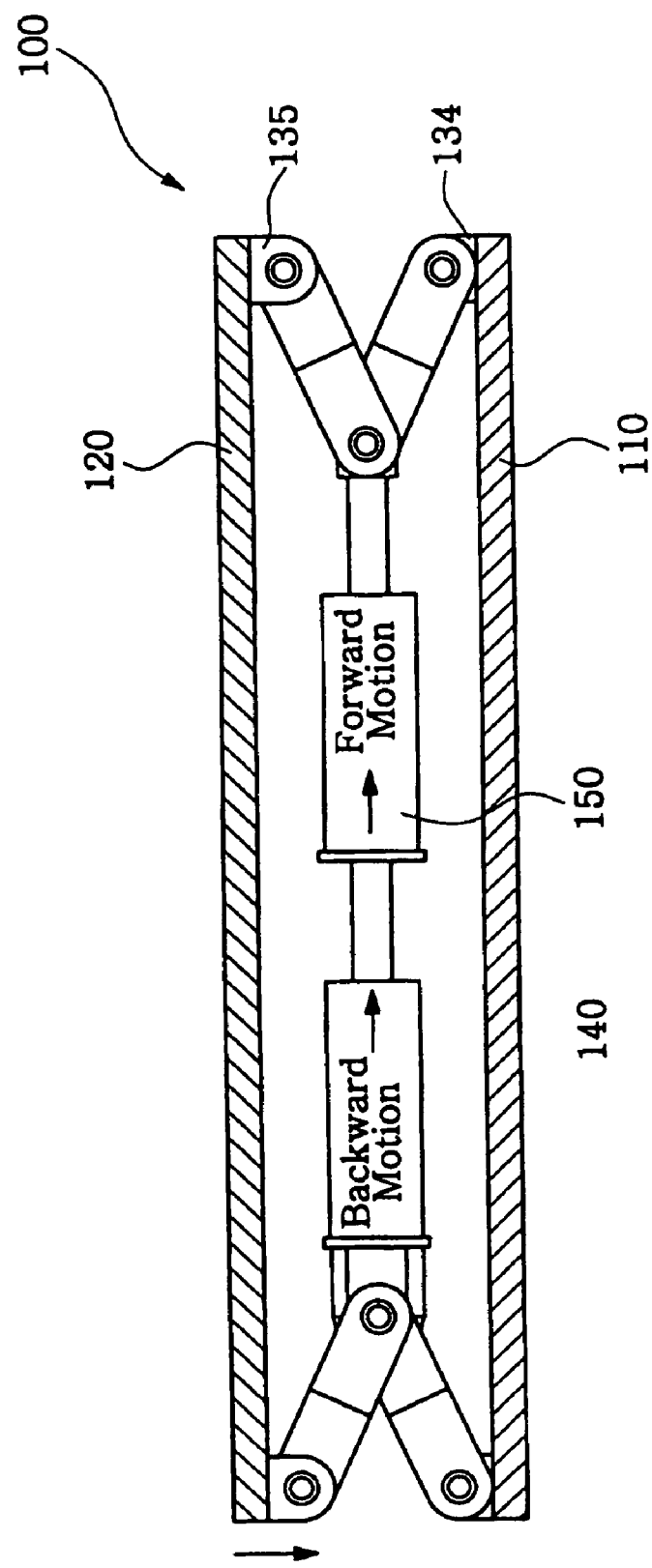

Second, the case in which no electric component is mounted on a lower surface of a printed circuit board and the back-up pin is not used (an upward and downward stroke of the back-up table: 5 mm or about 5 mm)
1) Upward movement: the first driving part—forward motion, the second driving part—backward motion (see FIG. 7)
2) Downward movement: the first driving part—backward motion, the second driving part—forward motion (see FIG. 8)

As described above, by appropriately selecting the strokes of the first driving part 140 and the second driving part 150, four positions of the back-up plate can be set by the following sets.
1) the first driving part—forward motion, the second driving part—forward motion (Upward position) (see FIG. 6)
2) the first driving part—forward motion, the second driving part—backward motion (Downward position 1) (see FIG. 7)
3) the first driving part—backward motion, the second driving part—forward motion (Downward position 2) (see FIG. 8)
4) the first driving part—backward motion, the second driving part—backward motion (Downward position 3) (see FIG. 9)

In the case of the back-up table for a chip mounter 100 in accordance with an exemplary embodiment of the present invention, since the first driving part 140 and the second driving part 150 are serially disposed, it is possible to simplify the structure, maintain horizontality, and variously adjust the height of the back-up table 100 at any desired height. In particular, when the upward and downward short stroke of the back-up table is needed, it is possible to significantly reduce the upward and downward moving time, thereby increasing equipment efficiency and reducing energy consumption. In addition, manufacturing costs can be significantly reduced.

Figure 10:
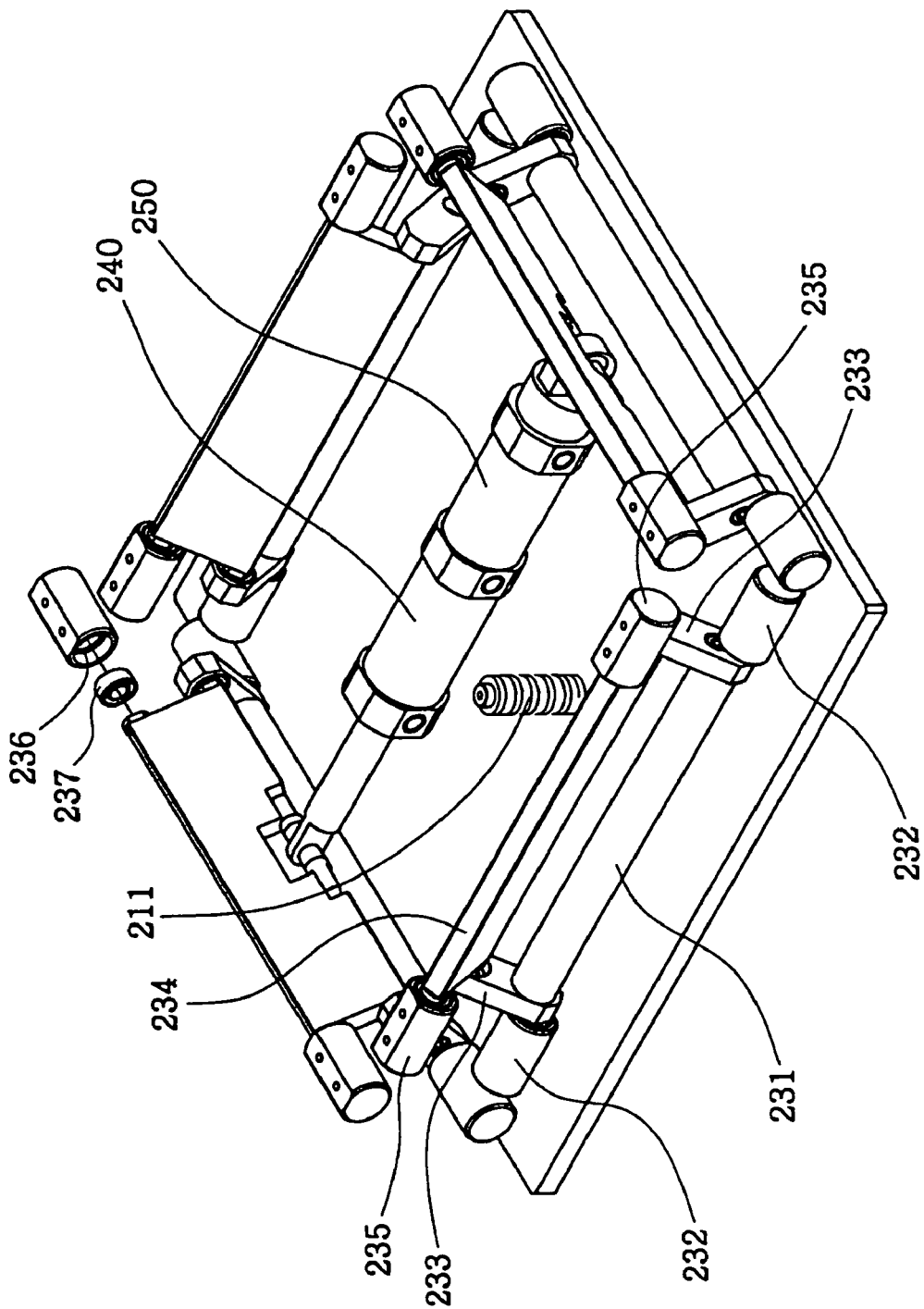
FIG. 10 is a perspective view of a back-up table for a chip mounter in accordance with another exemplary embodiment of the present invention.
Figure 11:
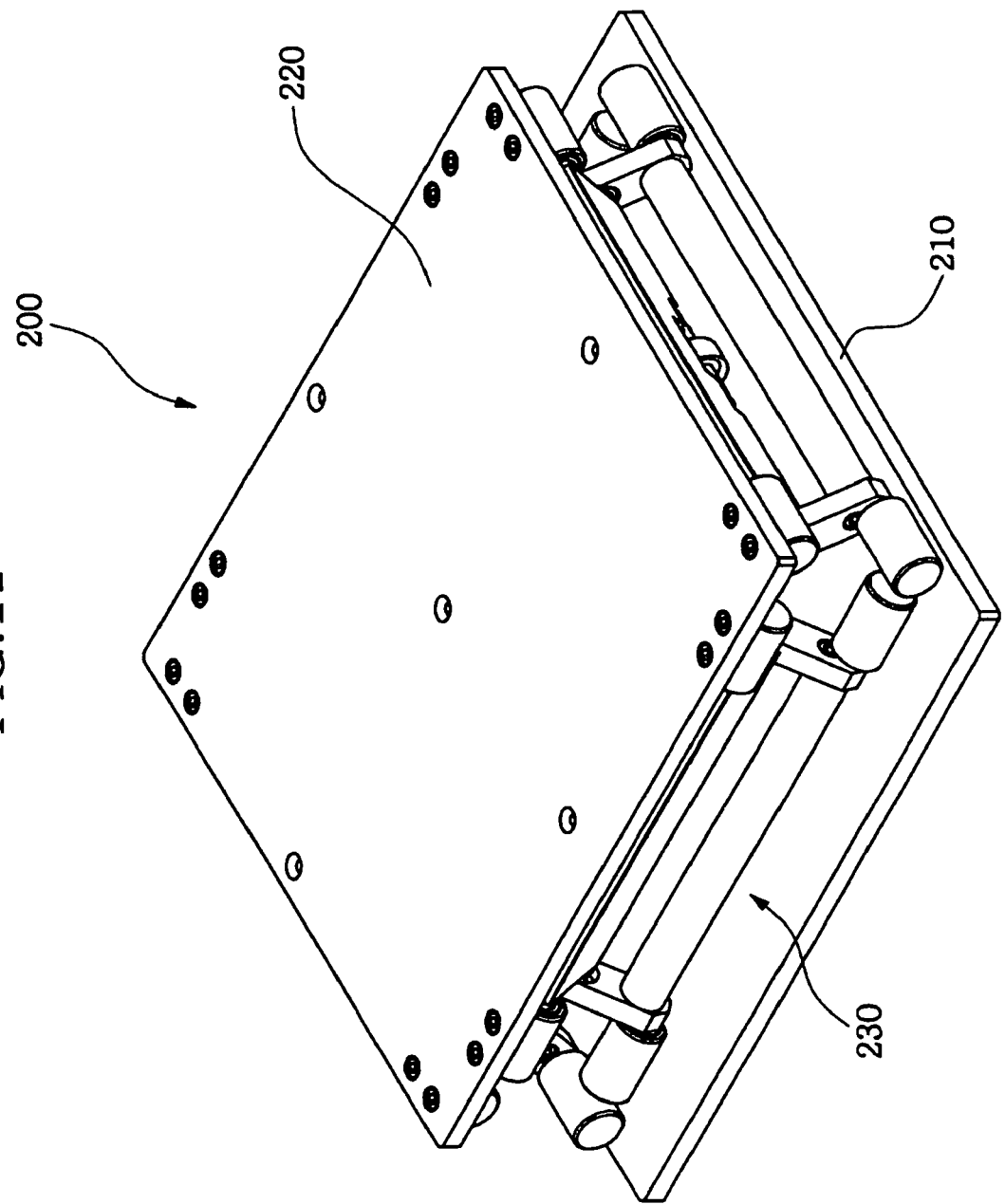
FIG. 11 is a perspective view showing an example of the interior of the back-up table for a chip mounter shown in FIG. 10.
Figure 12:
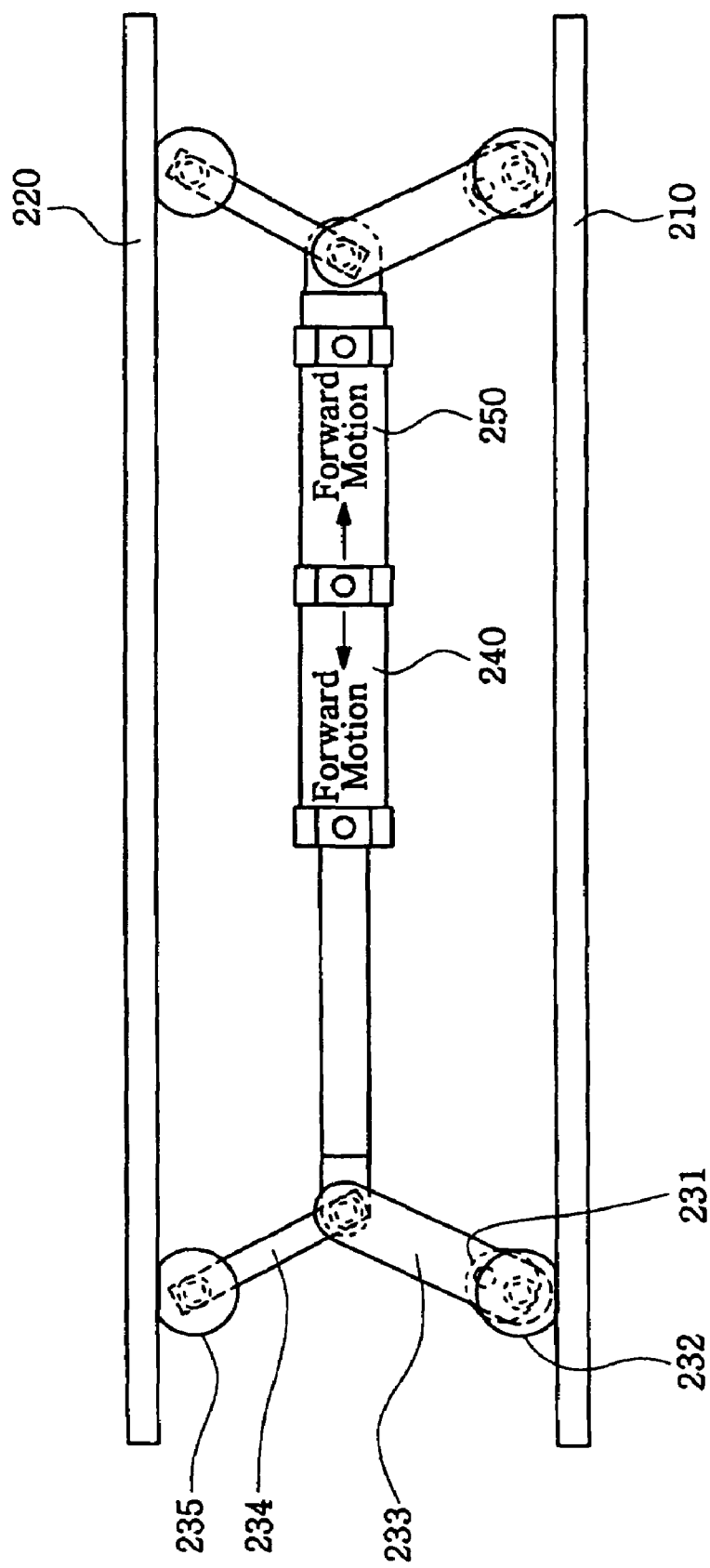
FIGS. 12 to 15 are views for explaining exemplary height adjustment of the back-up table depending on the drive of a first driving part and a second driving part, in the back-up table for a chip mounter shown in FIG. 10.
Figure 13:
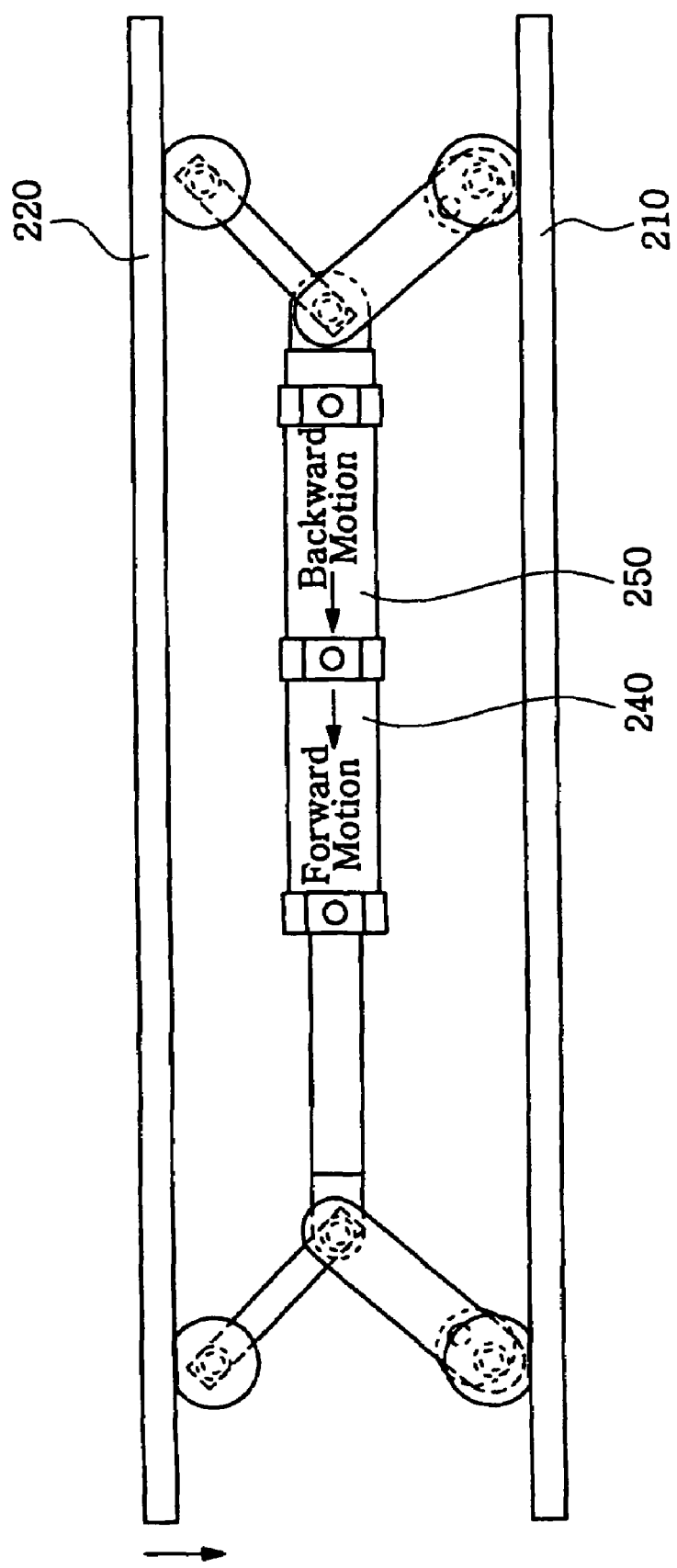
Figure 14:
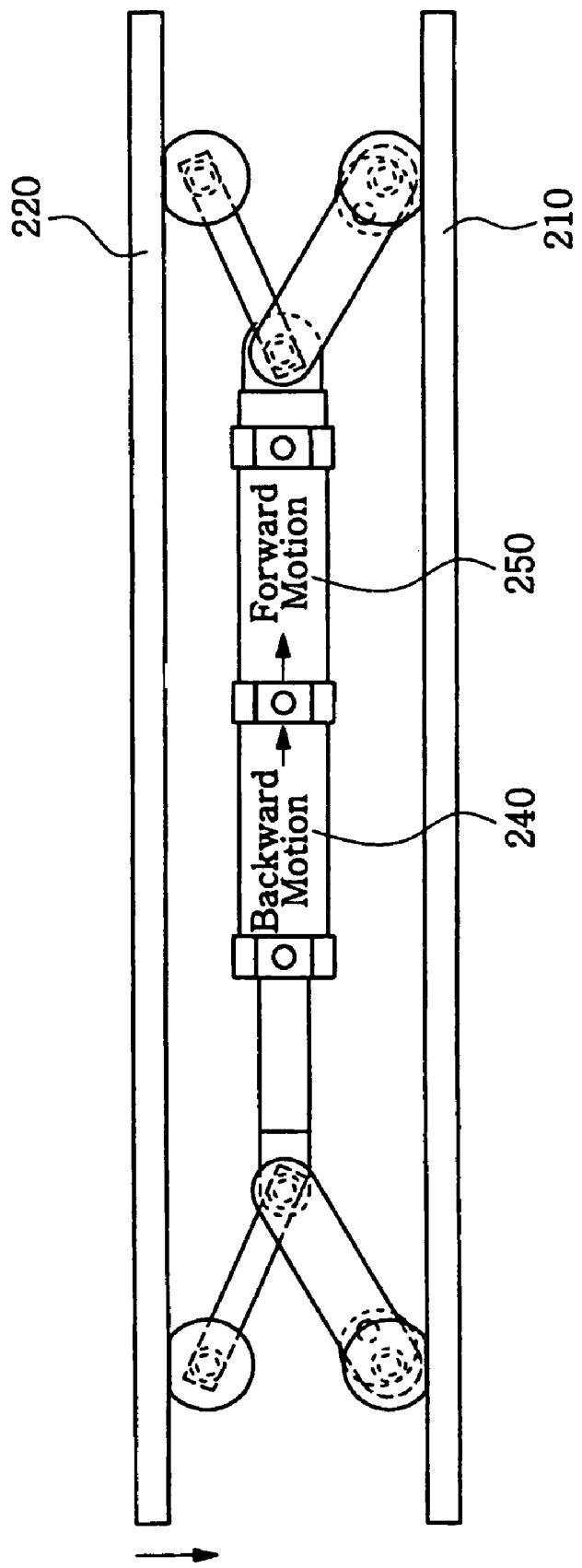

FIG. 10 is a perspective view of a back-up table for a chip mounter in accordance with another exemplary embodiment of the present invention, FIG. 11 is a perspective view showing the interior of the back-up table for a chip mounter shown in FIG. 10, and FIGS. 12 to 15 are views for explaining height adjustment of the back-up table depending on the drive of a first driving part and a second driving part, in the back-up table for a chip mounter shown in FIG. 10.

First, referring to FIGS. 10 and 11, the back-up table for a chip mounter in accordance with another exemplary embodiment of the present invention includes a base plate 210. A back-up plate 220 is installed over the base plate 210 and spaced a predetermined distance from the base plate 210. At least one set of folding units 230 are installed between the base plate 210 and the back-up plate 220.

A first driving part 240 is installed between the opposite folding units 230. The first driving part 240 functions to operate the folding units 230 to thereby raise or lower the back-up plate 220. A second driving part 250 is disposed adjacent to the first driving part 240 and serially connected to the first driving part 240. The second driving part 250 also functions to operate the folding units 230 to thereby raise or lower the back-up plate 220. The first driving part 240 and the second driving part 250 may be pneumatic cylinders. A resilient member, for example, a spring 211 is installed at an upper surface of the base plate 210 to upwardly support the back-up plate 220.

Each of the folding units 230 includes a rotary rod 231 rotatably installed at an upper surface of the base plate 210, a pair of first support brackets 232 fixed to the base plate 210 to support both ends of the rotary rod 231, a pair of links 233 coupled to both ends of the first support brackets 232, a pivot plate 234 coupled to the pair of links 233, and a pair of second support brackets 235 fixed to the back-up plate 220 to support both ends of the pivot plate 234.

The first support brackets 232 are fastened to the base plates 210 by bolts, and the second support brackets 235 are fastened to the back-up plate 220 by bolts. Bearings 237 are installed in the first support brackets 232, the links 233, and the second support brackets 235. The bearings 237 are supported by thresholds 236 formed in the first support brackets 232, the links 233, and the second support brackets 235.

Operation and effect of the back-up table for a chip mounter in accordance with another exemplary embodiment of the present invention will be described below.

As shown in FIGS. 10 and 11, in order to mount an electronic component 13 such as a semiconductor chip on a printed circuit board 12 introduced into a conveyor 11 of a chip mounter 10, the back-up table 200 functions to securely support the printed circuit board 12. When the first driving part 240 and the second driving part 250 are operated to outwardly push the pivot plate 234 using air pressure supplied from the exterior, pivotal movement of the links 233 and the pivot plate 234 raises the pivot plate 234 to securely support a rear surface of the printed circuit board 12, thereby raising the printed circuit board 12 to a predetermined position. Here, the first support brackets 232 support both ends of the rotary rod 231, and the second support brackets 235 support both ends of the pivot plate 234.

By appropriately selecting the strokes of the first driving part 240 and the second driving part 250, four positions of the back-up plate can be set by the following sets.

Figure 15:
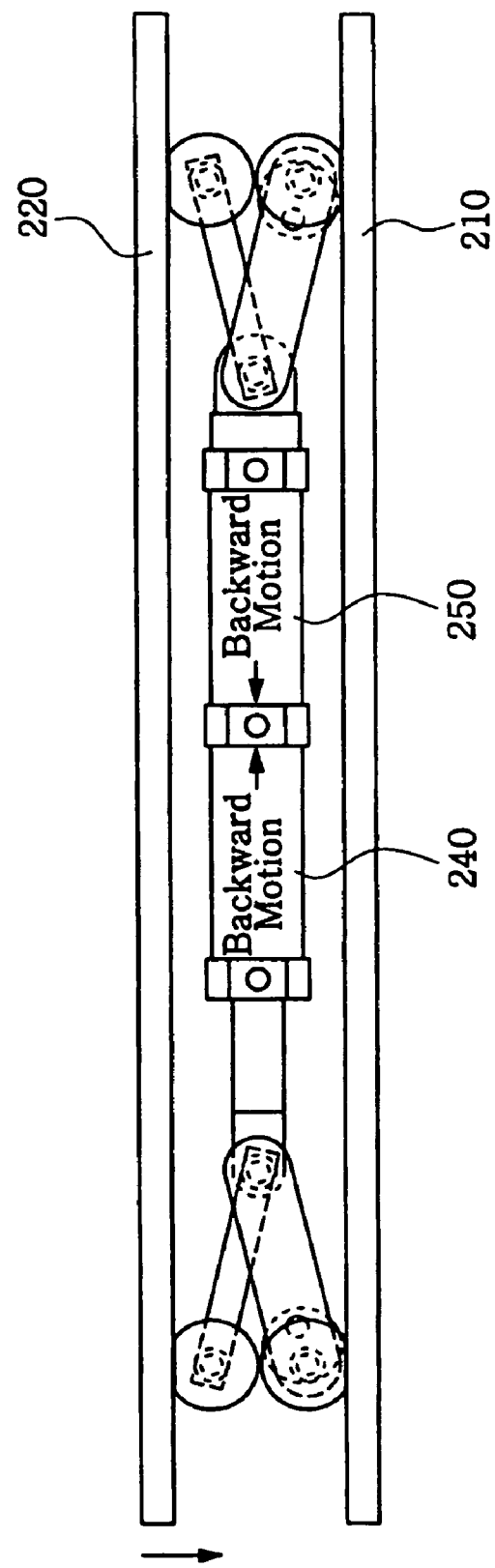

1) the first driving part—forward motion, the second driving part—forward motion (Upward position) (see FIG. 12)
2) the first driving part—forward motion, the second driving part—backward motion (Downward position 1) (see FIG. 13)
3) the first driving part—backward motion, the second driving part—forward motion (Downward position 2) (see FIG. 14)
4) the first driving part—backward motion, the second driving part—backward motion (Downward position 3) (see FIG. 15)

The back-up table for a chip mounter 200 in accordance with another exemplary embodiment of the present invention is the same as the previous exemplary embodiment of the present invention in the structure in which the first driving part 240 is serially connected to the second driving part 250, but different from the previous exemplary embodiment of the present invention in the structure in which the folding units are employed to raise and lower the back-up plate. Therefore, it is possible to simplify the structure and variously adjust the height of the back-up table. In particular, the support bracket and bearing structure is employed to enable smooth upward and downward movement.

As can be seen from the foregoing, serial and horizontal connection of first and second driving parts makes it possible to simplify the entire structure, maintain horizontality, and variously adjust the height of the back-up table. In particular, when the upward and downward short stroke of the back-up table is needed, it is possible to significantly reduce the upward and downward moving time, thereby increasing equipment efficiency and reducing energy consumption.

In addition, manufacturing costs can be significantly reduced. Further, an operation time for periodical inspection such as maintenance of the back-up table can be reduced, and therefore, maintenance costs can also be reduced. Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A back-up table for a chip mounter, comprising:
   a base plate;
   a back-up plate spaced a predetermined distance from the base plate to support a back-up pin that supports a printed circuit board;
   at least one set of link units installed between the base plate and the back-up plate and facing opposite to each other;
   a first driving part installed between the opposite facing link units and operating the link units to raise and lower the back-up plate; and
   a second driving part serially connected to the first driving part.

2. The back-up table according to claim 1, wherein each of the link units comprises:
   a first link pivotally connected to an upper surface of the base plate; and
   a second link pivotally connected to a lower surface of the back-up plate and rotatably connected to the first link by a support pin.

3. The back-up table according to claim 1, wherein the first driving part and the second driving part include pneumatic cylinders.

4. The back-up table according to claim 2, wherein the base plate comprises at least one support protrusion extending from the upper surface of the base plate and to which the first link is connected.

5. The back-up table according to claim 2, wherein the back-up plate comprises at least one support protrusion extending from the lower surface of the back-up plate and to which the second link is connected.

6. The back-up table according to claim 1, further comprising:
   another set of said link units installed between the base plate and the back-up plate and facing opposite to each other.

7. The back-up table according to claim 2, wherein the first driving part is connected to one of the link units at a point at which the first and second links connect.

8. The back-up table according to claim 7, wherein the second driving part is connected to the other said link unit in the set of link units at a point at which the first and second links in that other said link unit connect.

9. The back-up table according to claim 1, wherein the second driving part further operates the link units to further raise and lower the back-up plate.

10. The back-up table according to claim 3, wherein the back-up plate is raised when at least one of the following occurs: the pneumatic cylinder of the first driving part extends its piston and the pneumatic cylinder of the second driving part extends its piston.

11. The back-up table according to claim 3, wherein the back-up plate is lowered when at least one of the following occurs: the pneumatic cylinder of the first driving part retracts its piston and the pneumatic cylinder of the second driving part retracts its piston.

12. A back-up table for a chip mounter, comprising:
   a base plate;
   a back-up plate installed over the base plate and spaced a predetermined distance from the base plate;
   at least one set of folding units installed between the base plate and the back-up plate and facing opposite to each other;
   a first driving part installed between the opposite facing folding units and operating the folding units to raise and lower the back-up plate; and a second driving part serially connected to the first driving part.

13. The back-up table according to claim 12, wherein a resilient member is installed at an upper surface of the base plate to upwardly support the back-up plate.

14. The back-up table according to claim 12, wherein each of the folding units comprises:
- a rotary rod rotatably installed at an upper surface of the base plate;
- a pair of first support brackets fixed to the base plate to support both ends of the rotary rod;
- a pair of links coupled to both ends of the first support brackets;
- a pivot plate coupled to the pair of links; and
- a pair of second support brackets fixed to the back-up plate to support both ends of the pivot plate.

15. The back-up table according to claim 14, wherein bearings are installed in the first support brackets, the links, and the second support brackets.

16. The back-up table according to claim 15, wherein the bearings are supported by thresholds formed in the first support brackets, the links, and the second support brackets.

17. The back-up table according to claim 14, wherein the first support brackets are fastened to the base plates by bolts, and the second support brackets are fastened to the back-up plates by bolts.

18. The back-up table according to claim 12, wherein the first driving part and the second driving part include pneumatic cylinders.

19. The back-up table according to claim 18, wherein the back-up plate is raised when at least one of the following occurs: the pneumatic cylinder of the first driving part extends its piston and the pneumatic cylinder of the second driving part extends its piston.

20. The back-up table according to claim 18, wherein the back-up plate is lowered when at least one of the following occurs: the pneumatic cylinder of the first driving part retracts its piston and the pneumatic cylinder of the second driving part retracts its piston.

* * * * *